(12) United States Patent
Trevor et al.

(10) Patent No.: US 6,402,974 B1
(45) Date of Patent: Jun. 11, 2002

(54) METHOD FOR ETCHING POLYSILICON TO HAVE A SMOOTH SURFACE

(75) Inventors: Jitske Trevor; Shashank Deshmukh, both of Sunnyvale; Jeff Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/361,683

(22) Filed: Jul. 27, 1999

(51) Int. Cl.[7] .................................................. C23F 7/00
(52) U.S. Cl. ............................ 216/67; 216/64; 216/70; 216/79; 156/345; 438/712; 438/719; 438/735
(58) Field of Search ............................. 216/67, 79, 64, 216/70; 438/719, 712, 735; 156/365

(56) References Cited

U.S. PATENT DOCUMENTS

| | | | |
|---|---|---|---|
| 4,214,946 A | 7/1980 | Forget et al. ................. 156/643 |
| 4,380,489 A | 4/1983 | Beinvogel et al. ........... 156/643 |
| 4,668,338 A | 5/1987 | Maydan et al. .............. 156/643 |
| 4,679,299 A | * 7/1987 | Szluk et al. ................... 29/571 |
| 4,842,683 A | 6/1989 | Cheng et al. ................. 156/345 |
| 4,886,569 A | 12/1989 | Ojha et al. .................... 156/643 |
| 5,110,411 A | 5/1992 | Long ............................ 156/656 |
| 5,160,408 A | 11/1992 | Long ............................ 156/656 |
| 5,219,485 A | 6/1993 | Wang et al. ................. 252/79.3 |
| 5,779,926 A | 7/1998 | Ma et al. ....................... 216/67 |
| 5,792,693 A | 8/1998 | Tseng ........................... 438/254 |
| 5,851,926 A | 12/1998 | Kumar et al. ................ 438/714 |
| 5,871,659 A | 2/1999 | Sakano et al. ................. 216/79 |

OTHER PUBLICATIONS

W.R. Runyan and K.E. Bean, "Semiconductor Integrated Circuit Processing Technology", (Ch. 6.3) 1990.

* cited by examiner

*Primary Examiner*—Sharidan Carrillo
*Assistant Examiner*—Michail Kornakov
(74) *Attorney, Agent, or Firm*—Shirley L. Church; Kathi Bean; Joseph Bach (57) ABSTRACT

In accordance with the present invention, during a polysilicon etch back, a controlled amount of oxygen ($O_2$) is added to the plasma generation feed gases, to reduce pitting of the etched back polysilicon surface. The plasma etchant is generated from a plasma source gas comprising: (i) at least one fluorine-containing gas, and (ii) oxygen. The invention may be practiced in any of a number of apparatus adapted to expose polysilicon to a plasma etchant. One preferred apparatus is a decoupled plasma source (DPS™, Applied Materials, Santa Clara, Calif.) etching system. Another preferred apparatus is a magnetically enhanced plasma (MXP™, Applied Materials, Santa Clara, Calif.) etching system. Preferably, the invention is practiced in an apparatus having a memory that stores instructions for carrying out the process of the invention, a processor adapted to communicate with the memory and to execute the instructions stored by the memory, an etch chamber adapted to expose the substrate to the etchant in accordance with instructions from the processor, and a port adapted to pass communications between the processor and the etch chamber.

16 Claims, 5 Drawing Sheets

METHOD FOR ETCHING POLYSILICON TO HAVE A SMOOTH SURFACE

BACKGROUND OF THE INVENTION

1. Field of the Invention

The present invention relates generally to a fabrication process for manufacturing semiconductor devices. More particularly, the present invention relates to a method and etchant for etching polysilicon.

2. Background

Polysilicon is widely used in semiconductor devices such as power transistors and deep trench capacitors. Power transistors are widely used in electrical systems requiring switches. For example, power transistors are found in numerous applications in the automotive industry. Deep trench capacitors are widely used in semiconductor device memory applications. In devices such as power transistors and deep trench capacitors, the polysilicon is subjected to a subtractive etch process known as "etch-back." The etch-back process may be used to remove the material being etched (such as polysilicon) from a surface, leaving only the portion of the material which fills cavities beneath the surface, or may be used to remove only a portion of a material layer on a surface, leaving a horizontal layer of the material on the surface after etch-back.

"Dry etching" or "plasma etching" involves exposing the material to be etched (polysilicon in this case) to a gaseous plasma. The plasma is typically created by RF excitation of a feed gas in a vacuum system, which generates reactive species from the feed gas, including species such as ions and other high energy species. These reactive species then react with and etch the polysilicon. "Reactive etching" relies primarily on diffusion to transport reactive species to the surface being etched, and is generally isotropic. Physical bombardment etching uses a voltage difference between the plasma and a substrate surface to accelerate charged species such as ions toward the substrate surface. Because of this acceleration, it is possible to achieve anisotropic etching. Reactive etching may be combined with physical bombardment etching.

When a sufficient voltage difference is used to drive charged species from the plasma toward a substrate, the etching proceeds at an appreciable rate in the direction of the acceleration of the charged species (normal to the substrate surface), while etching in lateral directions is minimal. This directionality is important in applications such as the etching of trench sidewalls perpendicular to the substrate surface. For a more detailed description of dry etch processes, see Runyan and Bean, Semiconductor Integrated Circuit Processing Technology, Ch. 6.3, pp. 269–280, 1990, which is incorporated herein by reference.

The chemical composition of an etchant plasma and the process conditions under which a substrate surface is exposed to chemically reactive species and/or physical bombardment by charged particles during dry etching can have significant effects on the properties of that surface.

Conventional feed gases used for plasma generation in the etch-back of polysilicon generally include at least one fluorine-containing gas. Inert gases such as argon (Ar), may also be included. Inert gases may be used as diluents, which facilitate control of the amount of reactive gas as well as other plasma properties. For anisotropic processes, inert gases may also be used to generate ions that contribute to anisotropic etching by bombarding the surface being etched. These non-reactive ions are unlikely to contribute to lateral etching, which is believed to be caused primarily by chemically reactive species. Chlorine gas ($Cl_2$) may also be included. It is believed that the presence of chlorine improves the uniformity of the etch process.

However, it is very difficult to achieve a smooth polysilicon surface using etch-back with conventional feed gases. In particular, grains of polysilicon are often separated from a polysilicon layer, leaving holes/pits that result in a rough surface.

Figure 1:
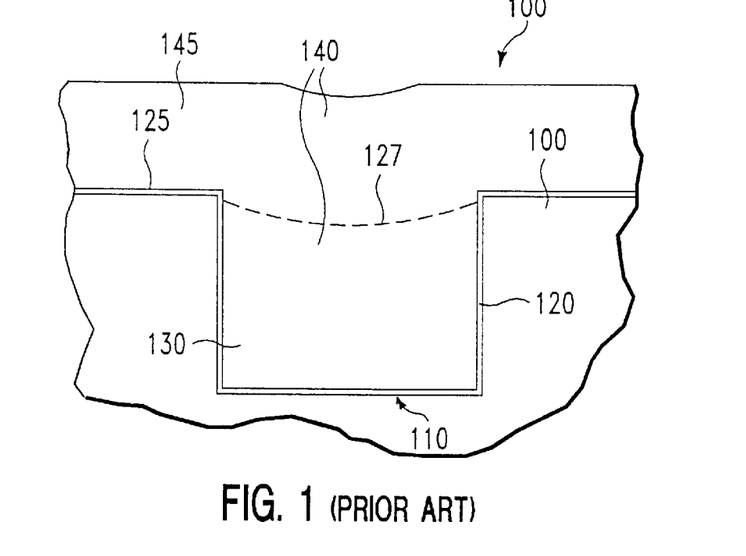
FIG. 1 (prior art) shows a cross-sectional schematic of a power transistor as it appears before and after a polysilicon "etch-back" process.

A power transistor is one example of a device that may incorporate etched-back polysilicon. FIG. 1 (prior art) shows a cross-sectional schematic of a typical power transistor 100 as it appears before and after a polysilicon "etch-back" process. Prior to etch-back, a trench 110 is present in an essentially single crystal silicon substrate 100. A gate oxide 120 covers the surfaces of silicon substrate 100, including the interior surfaces of trench 110. Typically, gate oxide 120 is silicon oxide. A polysilicon fill layer 140 both fills trench 110 and overlies the upper surface 125 of gate oxide layer 120. After etch-back, a portion 145 of polysilicon fill layer 140 is removed, so that a new polysilicon surface represented by, broken line 127 is formed. Back-etched polysilicon layer 130 remains, with surface 127 is slightly recessed into trench 110.

Figure 3:
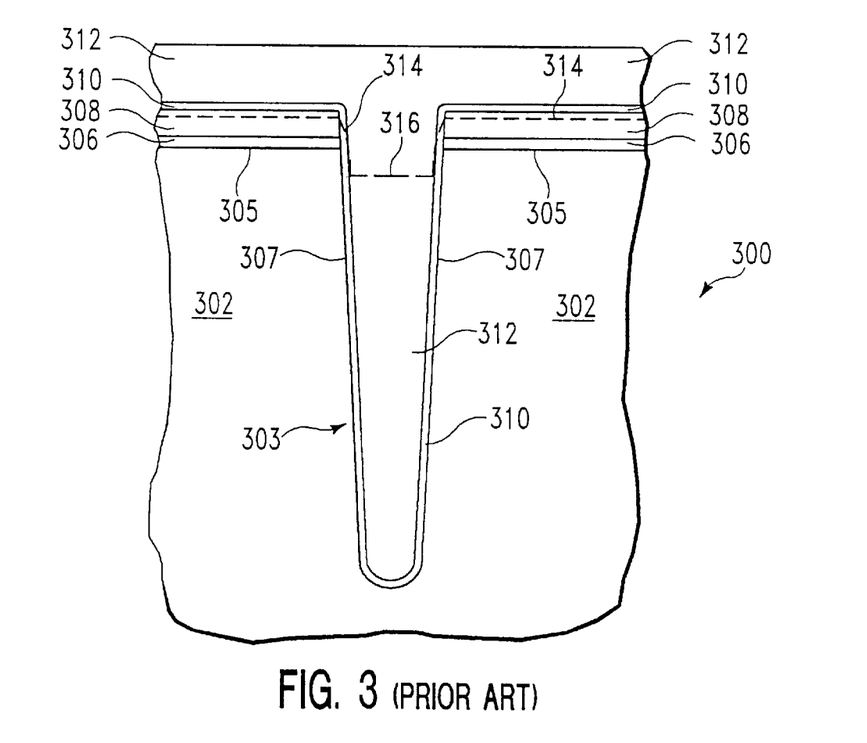
FIG. 3 (prior art) shows a cross-sectional schematic of a deep trench capacitor as it appears before and after a polysilicon "etch-back" process.

Another example of an application in which polysilicon etch-back is used is illustrated in FIG. 3 (prior art), which shows a cross-sectional schematic of a typical deep trench capacitor 300 as it appears before and after a polysilicon "etch-back" process. Prior to polysilicon etch-back, the device structure is as follows: A trench 303 is present in a silicon substrate 302. The silicon substrate 302 is essentially single crystal silicon, as opposed to polysilicon. A dielectric (typically silicon oxide) 306 covers the upper surface of silicon substrate 302. An etch barrier layer 308 (typically silicon nitride) overlies dielectric layer 306, followed by a conformal layer of silicon oxide 310 which covers the surface of etch barrier layer 308 and the interior surface 307 of trench 303 in silicon substrate 302. Finally, polysilicon fill layer 312 fills the trench and overlies the upper surface of silicon oxide conformal layer 310. After polysilicon etch back, the upper surface of the device structure is illustrated by broken line 314, where the upper surface of the etched-back polysilicon 316 is recessed into trench 303.

When conventional dry etch processes are used to etch-back the polysilicon, significant surface roughness is created on surface of the etched polysilicon, as described in detail below with reference to FIG. 2A.

Figure 2A:
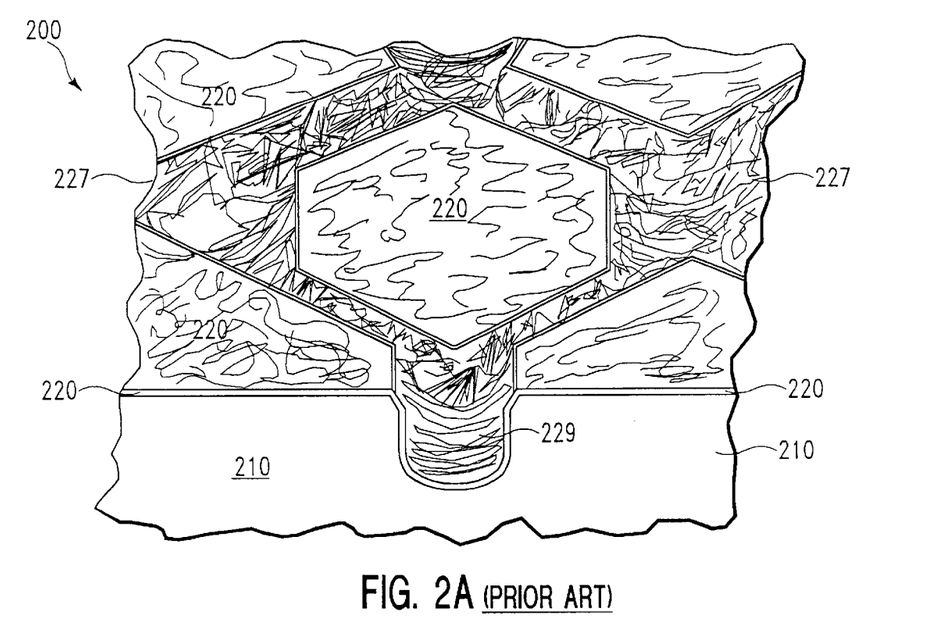
FIG. 2A (prior art) shows a schematic based on a photomicrograph of an etched-back power transistor polysilicon surface having holes (pitting) caused by a conventional etch processes.

FIG. 2A (prior art) shows a power transistor 200 similar to that shown in the FIG. 1 schematic, after portion 145 has been removed. In FIG. 2A, the etched surface of a polysilicon layer 227 has holes/pits 229 caused by the conventional etch-back process. These pits 229 may detrimentally affect the performance of a device, such as a power transistor, that incorporate polysilicon layer 227. In particular, the characteristics of materials deposited on the surface of polysilicon layer 227 may be adversely affected by the pits 229.

SUMMARY OF THE INVENTION

In accordance with the present invention, during a polysilicon etch back, a controlled amount of oxygen ($O_2$) is added to the plasma generation feed gases, to reduce pitting of the etched back polysilicon surface. The plasma etchant is generated from a plasma source gas comprising: (i) at least one fluorine-containing gas, and (ii) oxygen.

The invention may be practiced in any of a number of apparatus adapted to expose polysilicon to a plasma etchant.

One preferred apparatus is a decoupled plasma source (DPS™, Applied Materials, Santa Clara, Calif.) etching system. Another preferred apparatus is a magnetically enhanced plasma (MXP™, Applied Materials, Santa Clara, Calif.) etching system. Preferably, the invention is practiced in an apparatus having a memory that stores instructions for carrying out the process of the invention, a processor adapted to communicate with the memory and to execute the instructions stored by the memory, an etch chamber adapted to expose the substrate to the etchant in accordance with instructions from the processor, and a port adapted to pass communications between the processor and the etch chamber.

DETAILED DESCRIPTION OF THE INVENTION

When a polysilicon layer is etched-back using conventional dry etch processes, the remaining polysilicon surface has significant surface roughness (pitting), as shown in FIG. 2A. The etched-back polysilicon layer 227 of power transistor 200 exhibits pits 229, and the silicon oxide layer 220 (overlying silicon substrate 210) also exhibits surface roughness. The pitting 229 may adversely affect the properties of devices incorporating the polysilicon.

The inventors have discovered that etching-back polysilicon with a feed gas that includes oxygen ($O_2$) in addition to at least one fluorine-containing gas dramatically decreases the pitting of the polysilicon remaining after etch-back. While not intending to be limited as to any explanation as to why the present invention works, it is believed that the conventional etching process preferentially attacks the grain boundaries of the polysilicon, to the point where individual grains of silicon become separated from the polysilicon during etching. When oxygen gas is added to the feed gas, this preferential attack is blocked, possibly by oxidation at the grain boundary.

Figure 2B:
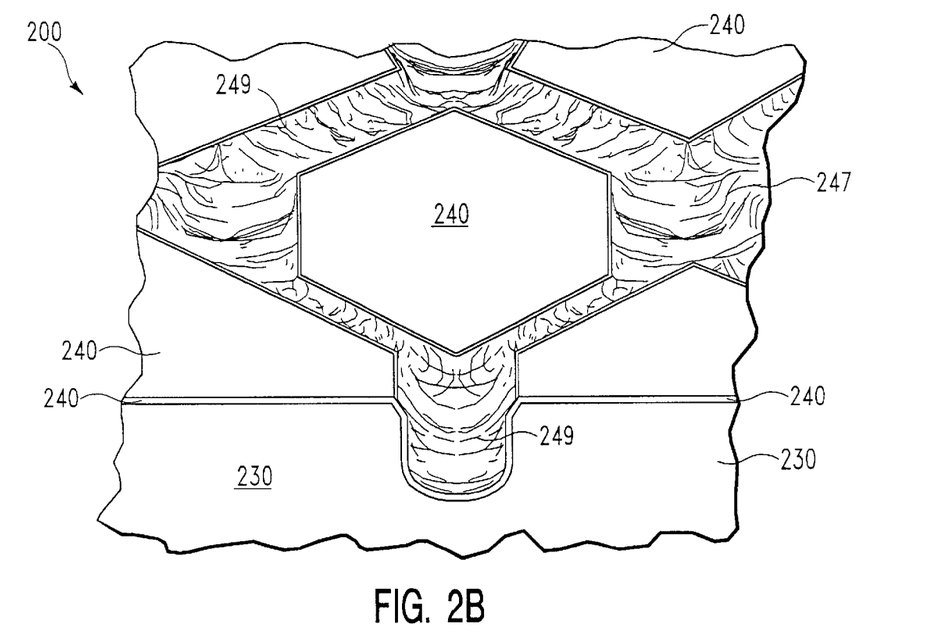
FIG. 2B shows a schematic based on a photomicrograph of an etched-back power transistor polysilicon surface created using the method of the present invention.

FIG. 2B shows an etched-back surface of a polysilicon layer 247 obtained using the method of the present invention. The etched-back surface exhibits "waves" 249, but these are much smoother than the pits 229 obtained using previous etch-back methods. Testing has indicated that the FIG. 2B waves 249 on the etched-back surface of polysilicon layer 247 of power transistor structure 200 do not have the same detrimental effect on the completed device structure as the pitting 229 shown in FIG. 2A.

As used herein, the term "element-containing gas" refers to a gas having molecules that contain an atom of the particular element. For example, carbon tetrafluoride ($CF_4$), nitrogen trifluoride ($NF_3$) and sulfur hexafluoride ($SF_6$) are "fluorine-containing gases." The terms "including" and "comprising" are used, inter alia, to describe a feed gas that is a mixture of the particular gases included, and that may include additional gases as well. For example, a mixture of $CF_4$, $NF_3$ and Ar may be described as "including" $CF_4$ and $NF_3$. The terms "including" and "comprising" are not intended to limit when the gases are mixed. For example, a feed gas including $CF_4$ and $O_2$ may be implemented by feeding the two gases into a vacuum chamber via separate routes. Alternatively, such a feed gas may be implemented by first mixing the gases, and then feeding the mixture into the vacuum chamber.

The amount of oxygen gas present in the feed is preferably less than 60% by volume. A larger amount of oxygen gas may unacceptably slow or stop the etching process. More preferably, the amount of oxygen gas is between about 10 and 25% by volume of the feed gas. Significantly larger amounts of oxygen gas may undesirably decrease the etch rate, and significantly smaller amounts of oxygen gas may not be as effective at decreasing the surface roughness of polysilicon. However, amounts of oxygen as low as 1% or 2% may still have a favorable effect.

The fabrication of deep trench capacitors that incorporate polysilicon is one suitable application for the present invention, and the description herein is generally with respect to the fabrication of such deep trench capacitors. Although the method of the invention can obviously be used in any polysilicon etch back process. In addition, the description herein is generally with respect to a few preferred apparatus and process parameters. However, the invention may be used with a variety of other apparatus adapted to expose a substrate to a plasma and may be practiced using process parameters other than those of the preferred embodiments described herein.

Preferred Apparatus For Practicing The Method
 Decoupled Power Control Apparatus A preferred embodiment method of the invention is practiced in a process apparatus which allows for separate control of a "plasma source power" that generates the plasma, and a "bias power" used to generate a "bias voltage" difference between the plasma and the substrate. The bias voltage affects the acceleration of high energy species that bombard the substrate surface. The CENTURA® DPS™ silicon etch system available from Applied Materials, Inc. of Santa Clara, Calif. is an example of a such a system. However, the present invention may be practiced in an apparatus having a plasma source that is not decoupled, i.e., the plasma source power and the bias power are not separately controllable, or in any other type of apparatus adapted to expose a substrate to a plasma. The decoupled power control apparatus is particularly useful for deep trench capacitors and other similar device structures having a high aspect ratio, where power transistors and other device structures having a lower aspect ratio may be formed easily in a parallel plate apparatus or other similar standard etching systems.

Figure 4:
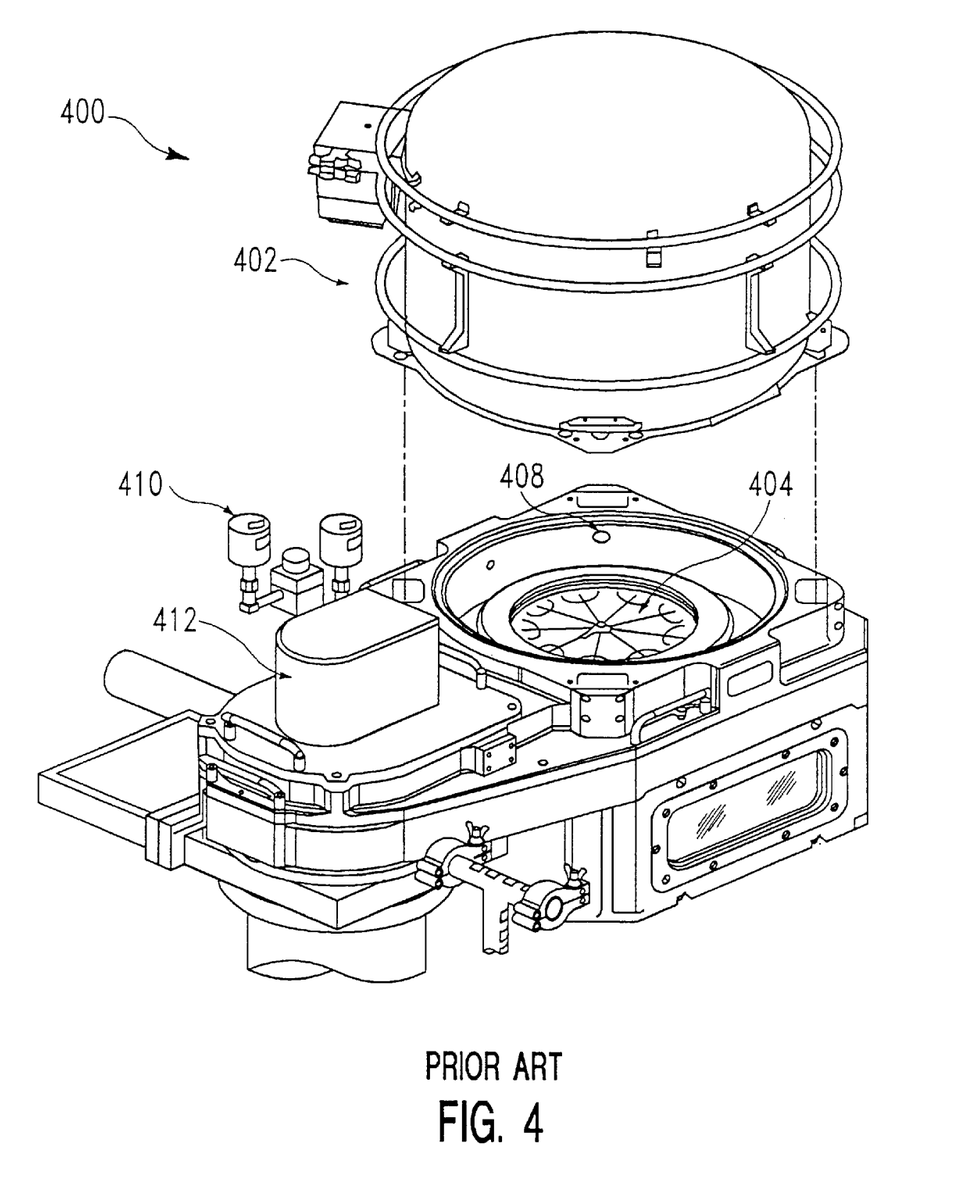
FIG. 4 (prior art) shows a chamber of a decoupled plasma source etch system of the kind available from Applied Materials, Inc.

FIG. 4 (prior art) shows a process chamber 400 of the type used in a preferred etch system. Chamber 400 includes a ceramic dome 402 and a standard monopolar electrostatic chuck (ESC) 404. Gas is introduced into chamber 400 via four ceramic gas injection nozzles 408 for uniform gas distribution. Chamber pressure is controlled by a closed-loop pressure control system 410 used in combination with a throttle valve 412.

Chamber 400 uses an inductive plasma source to generate the plasma, typically having a frequency tuned at approximately 12.56 MHZ, which generates and sustains a high density plasma (i.e., having an etectron density of at least about $10^{11}$ e-/cm$^3$). A 13.56 MHZ RF power source is typically used to generate the bias power, which is applied to the substrate support pedestal, to create a voltage difference between the plasma and the substrate. In the preferred apparatus, each watt of bias power generally produces about 1 volt of applied bias. The conversion from bias power watts to volts is highly dependent upon chamber geometry, and may be different in apparatus other than the apparatus described herein. The independent control of the plasma source and bias powers allows independent control of high energy species density and ion acceleration, respectively, which provides a highly uniform plasma (<5% variation) with a wide process window over changes in source and bias power, pressure, and feed gas chemistry.

Figure 5:
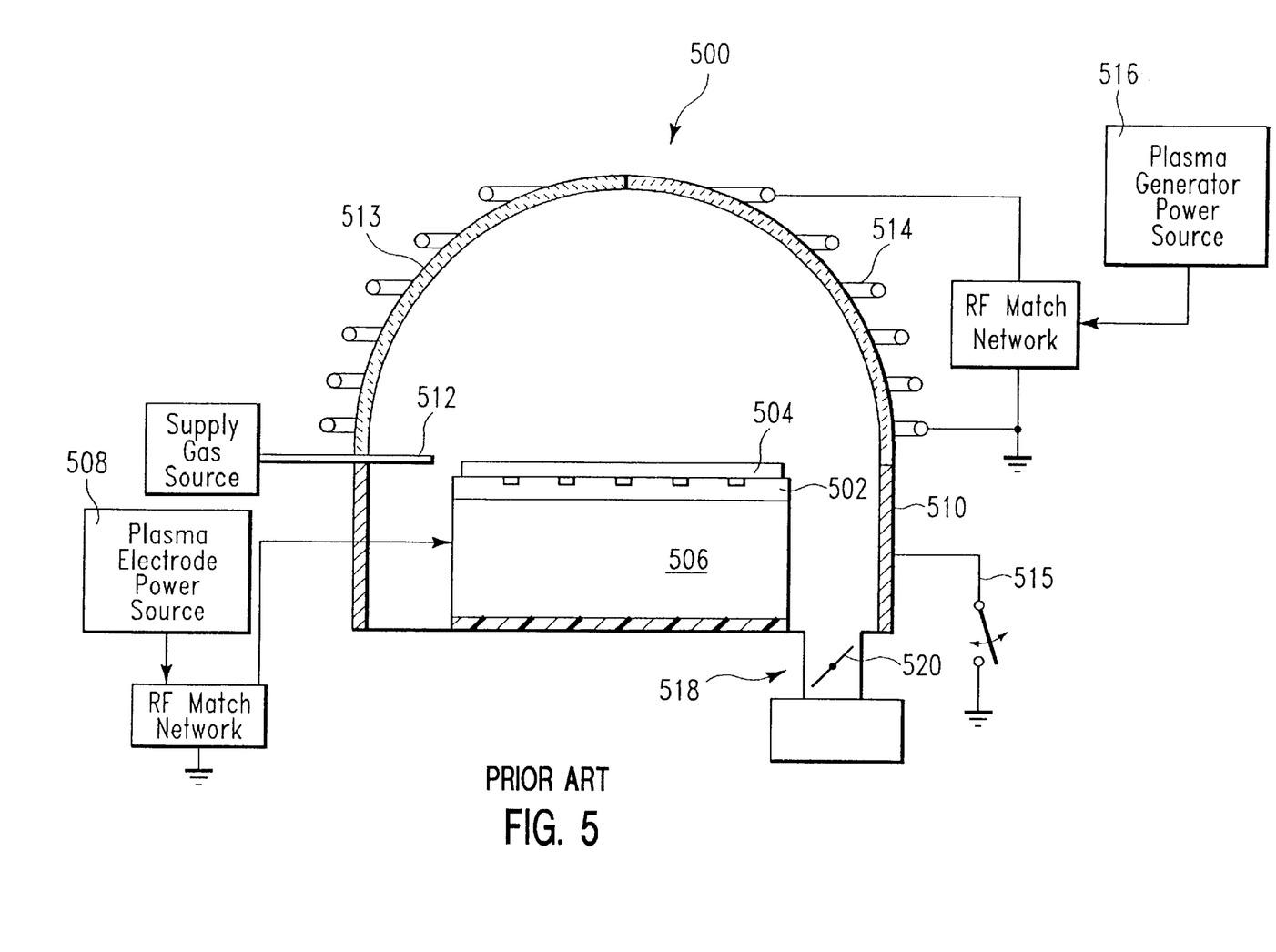
FIG. 5 (prior art) shows a schematic of a cross-sectional view of a chamber of the kind shown in FIG. 4, with emphasis on the critical elements within the chamber.

FIG. 5 (prior art) shows a vertical cross-section of a chamber 500, similar to chamber 400 of FIG. 4. Electrostatic chuck 502 is adapted to hold a substrate 504. Electrostatic chuck 502 overlies a cathode plasma electrode 506, which is electrically connected to an independently controlled plasma electrode (RF) power source 508. The upper portion 513 of the chamber wall is typically comprised of a ceramic material. The lower portion 510 of the chamber wall is typically comprised of aluminum which is electrically grounded by switch 515. A plasma source gas is introduced into and distributed throughout chamber 500 by means of a gas distributor 512 peripherally disposed above substrate 504. Typically, plasma active species are formed from the plasma source gas by applying an RF current to an inductive coil plasma generator 514, which is connected to an independently controlled plasma generator (RF) power source 516. The cathode electrode 506 is electrically biased with respect to the anode electrode 510 by applying an RF voltage to the cathode electrode 506 via power source 508, so that the active species formed in chamber 500 are attracted toward substrate 504. Spent process gas and etchant by-products are exhausted from chamber 500 through an exhaust system 518. A throttle valve 520 is provided in exhaust system 518 to control the pressure in the chamber 500. A more detailed description of chamber 500 is found in U.S. Pat. No. 5,779,926, issued Jul. 14, 1998 to Ma et al., which is incorporated herein by reference in its entirety.

Using the preferred independently-controlled plasma source power and bias power apparatus, the plasma source power is preferably between about 100 and 700 Watts during processing, which should be adequate to generate a plasma of sufficiently high density. Lower plasma source powers may not generate a high density plasma (typically having an electron density of about $10^{11}$ e$^{31}$ /cm$^3$), and higher plasma source powers are more expensive.

Typically, for polysilicon etch-back in this apparatus, during planarization of the polysilicon, the plasma source power is in the range of about 700 Watts and the substrate bias power is in the range of about 100 Watts. During recess etch, the plasma source power is in the range of about 100 Watts and the substrate bias power is about 0 and 50 watts, which generates an RF voltage difference between the plasma and the substrate of about 20 volts (self bias) to 50 volts. Lower bias voltages reduce the etch rate. An excessive bias voltage may cause damage to the substrate. The bias power frequency is preferably about 13.56 MHZ, which generally gives good profile control, but may vary over a wide range from as low as 30 kHz up to multiples of 13.56 MHZ.

Preferably, the total pressure in the chamber is maintained between about 2 to about 10 mTorr during etching. Lower pressures may lead to plasma instability, and higher pressures may lead to etch nonuniformity. More preferably, the pressure is about 3 mTorr for planarization etch-back and about 10 mTorr for recess etch-back, although it is possible to do both at a single pressure (which is typically toward the lower side of this range).

Generally, the substrate is cooled during etch processing, by means of a coolant passed to a channel in the substrate support electrode (not shown). In addition, a flow of a coolant such as helium can be passed between the substrate and the substrate support to enhance cooling and maintain the temperature of the substrate within the desired range. In the preferred apparatus, the temperature of the cathode is directly measured by a thermocouple. Preferably, the cathode temperature is maintained at about 10° C. to 70° C., and more preferably about 20° C. The temperature of the substrate is an important process parameter. In the preferred apparatus, the substrate temperature is not directly measured, but is generally about 10° C. to 20° C. higher than the measured cathode temperature. The substrate temperature is therefore preferably about 20° C., to about 40° C. and is more preferably about 30° C.

MXP™ Apparatus

In another preferred embodiment, the invention is practiced in a magnetron-enhanced plasma processing apparatus. This apparatus provides a magnetic field in a region of an etch chamber containing plasma. This magnetic field confines electrons within the plasma, thereby enhancing the plasma by increasing electron density. The MXP and MXP+ polysilicon etch chambers, available from Applied Materials of Santa Clara, Calif., are examples of a magnetron-enhanced apparatus.

Figure 6A:
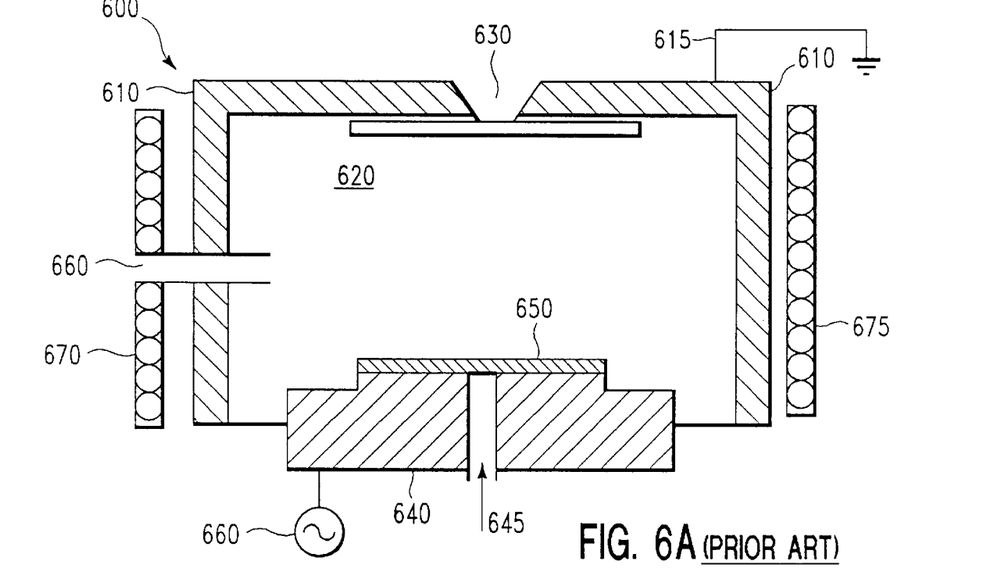
FIG. 6A (prior art) shows a schematic of a cross-sectional view of a magnetically enhanced plasma etch system of the kind available from Applied Materials, Inc.

FIG. 6 (prior art) shows a magnetron enhanced process chamber 600. The chamber 600 includes walls 610 housing a reactor chamber 620. A plasma source gas is introduced to the chamber 620 via a distribution nozzle and plate 630. Nozzle and plate 630 is connected to walls 610 which are grounded via line 615. A cathode support electrode 640 supports a wafer 650 to be treated. Wafer 650 is passed into the chamber by means of a slit valve 660. Cathode support electrode 640 is connected to a power source 660 and is also connected to an elevator mechanism (not shown) for raising and lowering support 640 while wafer 650 is moved into and out of chamber 600. Wafer 650 can be cooled by passing a flow of helium to the backside of wafer 650 via channel 645. Conventional clamps or fingers (not shown) connected to support electrode 640 maintain wafer 650 in alignment during processing. A suitable pressure is maintained in the chamber by an exhaust system (not shown.) RF power source 660 is used to generate a plasma source power between walls 610, which act as an anode, and cathode support electrode 640. This plasma source power acts to generate a plasma etchant from the plasma source gas fed into chamber 620.

Figure 6B:
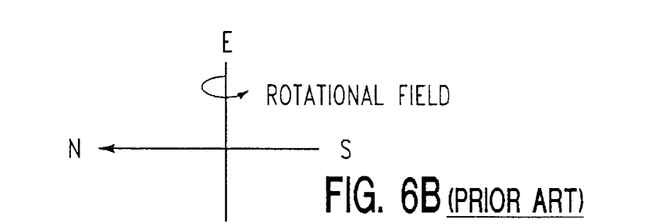
FIG. 6B (prior art) shows the vector of the magnetic field-generated in the process chamber of FIG. 6A.

A pair of Helmholtz configured electromagnetic coils 670 and 675 provide a transverse magnetic field with the north and south poles at the left and right providing a horizontal magnetic field axis parallel to the surface of wafer 650. The transverse magnetic field is applied to slow the vertical velocity of electrons in the plasma which are accelerated radially by the magnetic field as they move towards wafer 650. Accordingly, the quantity of electrons in the plasma is increased by means of this transverse magnetic field and the plasma density is enhanced. Thus the potential drop across the cathode sheath can be decreased, to increase the ion current flux of high energy species present on the wafer surface, permitting higher rates of etching without requiring higher species energies to achieve this result. As shown in FIG. 6B, the vector of the magnetic field rotates about the center axis of the electrical field by varying the phases of current flowing through coils 670 and 675 at a typical rotational frequency of 0.01 to 1 Hz, producing a variable strength of the magnetic flux, typically from 0–150 Gauss, determined by the current supplied to the coils.

A more detailed description of MXP™ etch chambers in U.S. Pat. Nos. 5,851,926 to Kumar et al., 4,842,683 to Cheng et al., and 4,668,338 to Maydan et al., which are incorporated herein by reference in their entirety.

When using the preferred MXP+™ polysilicon etch chamber from Applied Materials to practice the present invention, the plasma source power is preferably between about 200 and 450 watts during processing, to generate a plasma of sufficiently high density. Lower plasma source powers may not generate a high density plasma, and higher plasma source powers are more expensive. More preferably, the plasma source power is about 300 watts. The magnetic field is preferably between about 0 Gauss and about 50 Gauss, and is more preferably about 30 Gauss.

Preferably, the total pressure in the chamber is maintained between about 100 and 300 millitorr during etching. Lower pressures may lead to rounding of corners in the etched features, and higher pressures may lead to decreased etch rates. More preferably, the pressure is about 150 millitorr.

Preferably, the cathode temperature is maintained at about 20° C. to 60° C., and more preferably about 30° C. The substrate temperature is typically about 25° C. to about 35° C. higher than the measured cathode temperature in the preferred MXP+ apparatus. The substrate temperature is therefore preferably between about 55° C. and 65° C., and more preferably about 55° C.

Optimal values for many of the preferred parameters described above are highly dependent upon a number of factors, including the type of apparatus used (DPS, MXP, or otherwise), the apparatus geometry, and the values of the other parameters. It should therefore be recognized that it is possible to practice the present invention using parameters outside of the preferred ranges, particularly when an apparatus other than the preferred apparatus is used. One of skill in the art should be able to determine an optimal set of parameters for use with a particular apparatus with minimal experimentation.

Computer Control

Figure 7:
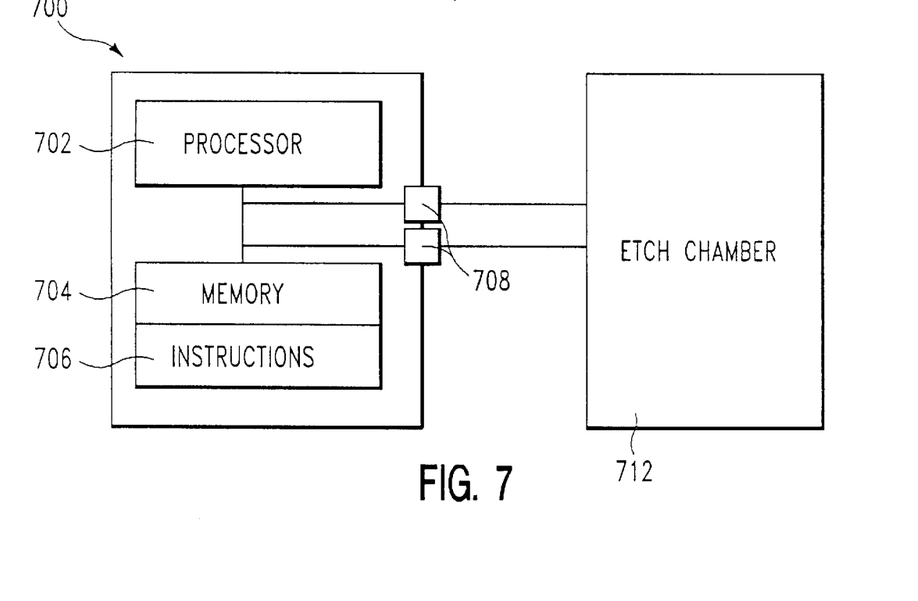
FIG. 7 shows a computer adapted to control a plasma etch system.

Preferably, the apparatus used to practice the present invention is adapted to be controlled by a computer. FIG. 7 shows a computer 700. Computer 700 comprises a processor 702, memory 704 adapted to store instructions 706, and one or more ports 708. Processor 702 is adapted to communicate with memory 704 and to execute instructions 706. Processor 702 and memory 704 are also adapted to communicate with one or more ports 708. Ports 708 are adapted to communicate with a plasma etch chamber 712. Plasma etch chamber is adapted to carry out process steps in accordance with signals received from processor 702 via ports 708. Preferably, computer 702 can control the composition and feed rate of the plasma source gas, the temperature, the pressure in the chamber, the bias power, the plasma source generation power. Preferably, computer 702 is adapted to receive measurements that describe the condition in the chamber, and adapt the process variables accordingly.

EXAMPLES

Example 1 (Comparitive Example)

A single-crystal silicon substrate having trenches in a hexagonal pattern was prepared using conventional techniques. The trenches were lined with SiN, and a blanket layer of polysilicon was deposited over the trenches. The resultant substrate was similar in appearance to the schematic cross-sectional view shown in FIG. 1, (prior to the removal of portion 145 of blanket layer 140 to produce a trench 110 containing fill layer 130).

The blanket layer of polysilicon was etched in the decoupled power control plasma etch apparatus previously described. Etching was carried out in a two step process (planarization followed by recess etch) in the same process chamber. The cathode (substrate support pedestal) temperature was held constant at about 20° C. The etch recipe for planarization was: 40 sccm of $SF_6$; 50 sccm of $CF_4$ ; the plasma source power was 750 Watts; the substrate bias power was 40 Watts and the process chamber pressure was about 3 mTorr. The etch recipe for recess etch was: 60 sccm of $SF_6$; the plasma source power was 100 Watts; the substrate bias power was 1 Watt and the process chamber pressure was about 10 mTorr.

After etching, the trench appeared similar to that shown in FIG. 2A, with the surface of polysilicon layer 227 exhibiting pitting 229 (where grains of polysilicon had been removed).

Example 2

A silicon substrate was prepared in the same manner as for Example 1. The blanket layer of polysilicon was etched in the preferred plasma processing apparatus described with reference to Example 1. The cathode (substrate support pedestal) temperature was held constant at about 20° C. The etch recipe for planarization was: 40 sccm of $SF_6$; 50 sccm of $CF_4$; 9 sccm of $O_2$; the plasma source power was 750 Watts; the substrate bias power was 40 Watts and the process chamber pressure was about 3 mTorr. The etch recipe for recess etch was: 60 sccm of $SF_6$; 10 sccm of $O_2$; the plasma source power was 100 Watts; the substrate bias power was 1 Watt and the process chamber pressure was about 10 mTorr.

After etching, the trench appeared similar to that shown in FIG. 2B, with the surface of polysilicon layer 247 exhibiting a soft waved pattern 249, and the surface of the silicon oxide layer 240 being smooth. Testing of devices having the soft waved pattern 249 in the surface back-etched,polysilicon layer 247 demonstrated that the presence of the wave pattern 249 does not cause the problems observed when pitting of the polysilicon surface (as produced in Comparitive Example 1) is present.

Example 3 (Comparitive Example)

A silicon substrate was prepared in the same manner as for Example 1.

The blanket layer of polysilicon was etched in the preferred MXP+™ polysilicon etch chamber. The feed gas was 20 sccm (25% by volume) $SF_6$ and 60 sccm (75% by volume) $Cl_2$. A plasma source power of 300 W was applied, and a magnetic field of 30 Gauss was generated. The substrate temperature was about 30° C. The pressure in the etch chamber was maintained at about 100 mTorr during the etch process.

After etching, the trench was similar in appearance to that of FIG. 2A. Pitting 229 similar to that shown of FIG. 2A was observed, where grains of polysilicon had been removed.

Example 4

A silicon substrate was prepared in the same manner as for Example 1. The blanket layer of polysilicon was etched in the preferred MXP+™ apparatus, as in Example 3. The feed gas was 80 sccm (80% by volume) $SF_6$, and 20 sccm (20% by volume) $O_2$. A plasma source power of 300 W was applied, and a magnetic field of 30 Gauss was generated. The substrate temperature was about 30° C. The pressure in the etch chamber was maintained at about 150 mTorr during the etch process.

After etching, the trench was similar in appearance to that shown in FIG. 2B. No pitting was observed, only waves 249 appeared on the polysilicon surface.

Similar experiments in the etch-back of polysilicon for deep trench capacitor applications have indicated that the addition of oxygen to the plasma source gas in the amount of about 20 % by volume to about 30 % by volume of the source gas reduces pitting in the etched polysilicon surface significantly.

While the foregoing is directed to preferred embodiments of the invention, other and further embodiments of the invention may be devised without departing from the basic scope thereof. The scope of the invention is determined by the claims that follow.

What is claimed is:

1. A method of reducing pitting of a surface of an etched-back polysilicon layer, comprising:
    conducting said etch-back using a plasma generated from a plasma source gas including at least one fluorine-containing gas and oxygen, wherein said oxygen comprises between about 1% and about 60% by volume of said plasma source gas, and wherein said etch-back is conducted in a process apparatus which permits separate control of a plasma source power which generates said plasma and a bias power used to generate a bias voltage upon a surface upon which said etch-back is carried out.

2. The method of claim 1, wherein said etch-back is conducted at a polysilicon surface temperature ranging from about 20° C. to about 40° C.

3. A method of reducing pitting of a surface of an etched-back polysilicon layer, comprising:
    conducting said etch-back using a plasma generated from a plasma source gas including at least one fluorine-containing gas and oxygen, wherein said oxygen comprises between about 1 % and about 60 % by volume of said plasma source gas, wherein said etch-back is conducted in a magnetron-enhanced plasma processing apparatus.

4. The method of claim 3, wherein said etch-back is conducted at a pressure ranging between about 100 mTorr and 300 mTorr and at a polysilicon surface temperature ranging from about 55° C. to about 65° C.

5. The method of claim 1, wherein the oxygen gas comprises between about 10% and about 25% by volume of the plasma source gas.

6. The method of claim 1, wherein the plasma source gas further comprises chlorine.

7. The method of claim 1, wherein the at least one fluorine-containing gas is selected from the group consisting of nitrogen trifluoride, carbon tetrafluoride, sulfur hexafluoride, and combinations thereof.

8. The method of claim 7, wherein the at least one fluorine-containing gas is sulfur hexafluoride ($SF_6$).

9. The method of claim 7, wherein the plasma source gas consists essentially of at least one fluorine-containing gas, chlorine, and oxygen.

10. The method of claim 1, wherein the temperature of the polysilicon during said etch-back is between about 30° C. and about 70° C.

11. The method of claim 1, wherein said etch-back is conducted at a process chamber pressure within the range of about 2 mTorr to about 10 mTorr.

12. The method of claim 3, wherein the oxygen gas comprises between about 10% and about 25% by volume of the plasma source gas.

13. The method of claim 3, wherein the plasma source gas further comprises chlorine.

14. The method of claim 3, wherein the at least one fluorine-containing gas is selected from the group consisting of nitrogen trifluoride, carbon tetrafluoride, sulfur hexafluoride, and combinations thereof.

15. The method of claim 14, wherein the at least one fluorine-containing gas is sulfur hexafluoride ($SF_6$).

16. The method of claim 14, wherein the plasma source gas consists essentially of at least one fluorine-containing gas, chlorine, and oxygen.

* * * * *